United States Patent
Ersoz

(10) Patent No.: US 10,996,299 B2
(45) Date of Patent: May 4, 2021

(54) SYSTEMS AND METHODS FOR WAVEFORM OPTIMIZATION FOR OBLIQUE SCANS

(71) Applicant: General Electric Company, Schenectady, NY (US)

(72) Inventor: Ali Ersoz, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 268 days.

(21) Appl. No.: 16/109,560

(22) Filed: Aug. 22, 2018

(65) Prior Publication Data

US 2020/0064426 A1 Feb. 27, 2020

(51) Int. Cl.
G01R 33/385 (2006.01)
G01R 33/54 (2006.01)

(52) U.S. Cl.
CPC ....... *G01R 33/3852* (2013.01); *G01R 33/543* (2013.01)

(58) Field of Classification Search
CPC .......................... G01R 33/3852; G01R 33/543
See application file for complete search history.

(56) References Cited

U.S. PATENT DOCUMENTS

| | | | |
|---|---|---|---|
| 4,748,410 A * | 5/1988 | Macovski .......... | G01R 33/4824 324/307 |
| 5,512,825 A | 4/1996 | Atalar et al. | |
| 6,700,374 B1 * | 3/2004 | Wu .................. | G01R 33/56554 324/306 |
| 2010/0308829 A1 * | 12/2010 | Vu ........................ | G01R 33/543 324/314 |
| 2012/0049845 A1 * | 3/2012 | Bito ..................... | G01R 33/485 324/309 |
| 2013/0009641 A1 * | 1/2013 | Hori ................... | G01R 33/4818 324/309 |

OTHER PUBLICATIONS

Atalar, E. et al., "Minimization of Dead-Periods in MRI Pulse Sequences for Imaging Oblique Planes," Magnetic Resonance in Medicine, vol. 32, No. 6, Dec. 1994, 13 pages.

* cited by examiner

*Primary Examiner* — Melissa J Koval
*Assistant Examiner* — Haidong Zhang
(74) *Attorney, Agent, or Firm* — McCoy Russell LLP

(57) ABSTRACT

Methods and systems are provided for optimizing gradient waveforms for oblique imaging. In one embodiment, a method comprises generating initial gradient waveforms in logical axes, evaluating area demand of each of the initial gradient waveforms, increasing a maximum amplitude of the initial gradient waveform in a first logical axis, reducing a maximum amplitude of the initial gradient waveform in a second logical axis, wherein the area demand in the first logical axis is greater than the area demand in the second logical axis, converting the gradient waveforms to physical gradient waveforms, and driving physical amplifiers of an imaging system with the physical gradient waveforms during a scan. In this way, oblique scans may be performed without a performance reduction caused by increases in echo time, repetition time, and echo spacing.

20 Claims, 13 Drawing Sheets

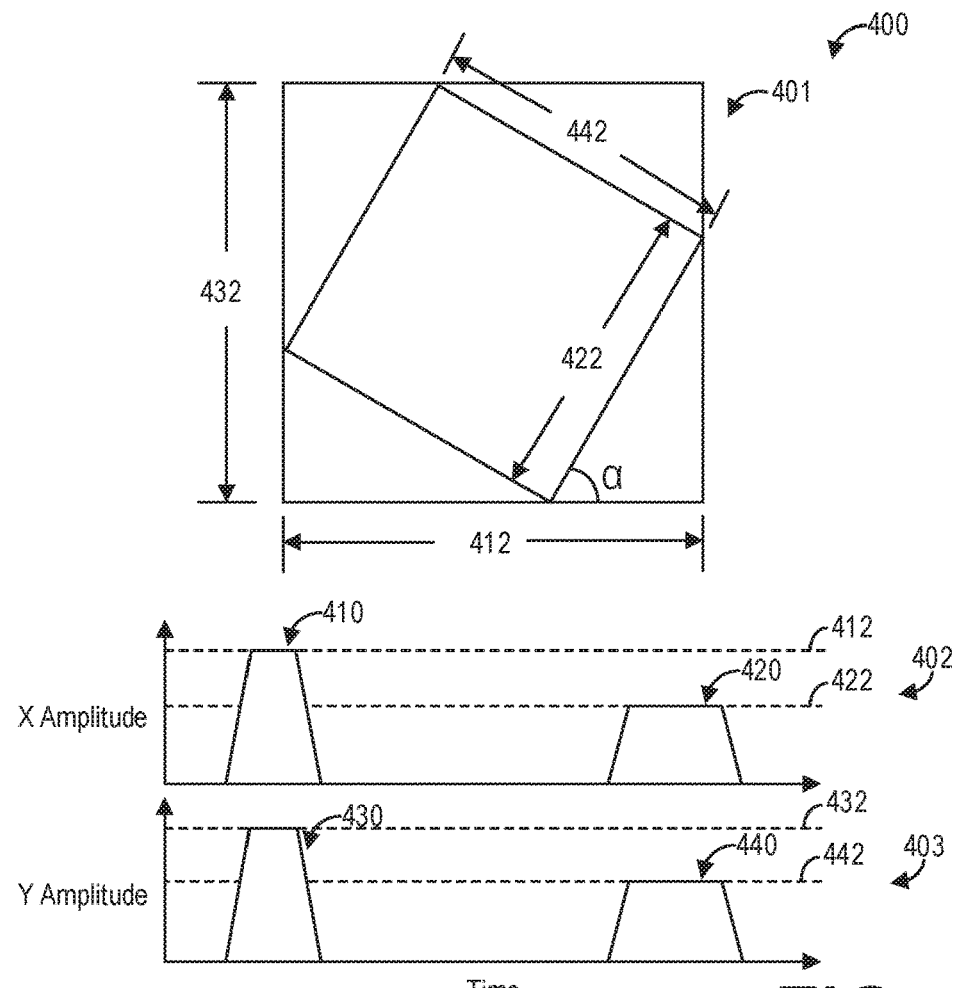
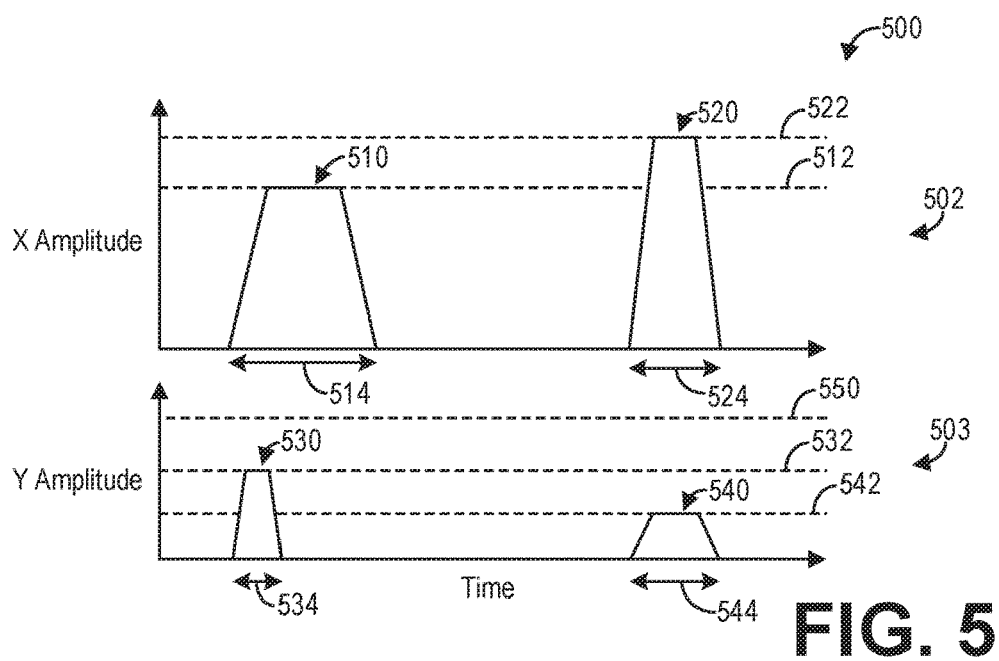
FIG. 4
FIG. 5

SYSTEMS AND METHODS FOR WAVEFORM OPTIMIZATION FOR OBLIQUE SCANS

FIELD

Embodiments of the subject matter disclosed herein relate to magnetic resonance imaging (MRI), and more particularly, to optimizing gradient waveforms for oblique imaging.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller-amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using reconstruction algorithms.

BRIEF DESCRIPTION

In one embodiment, a method for performing an oblique scan of magnetic resonance (MR) comprises generating initial gradient waveforms in logical axes including a frequency encoding axis, a phase encoding axis, and a slice selection axis, wherein maximum amplitudes of the initial gradient waveforms in the logical axes are equal, evaluating area demand of each of the initial gradient waveforms, increasing the maximum amplitude of the initial gradient waveform in a first logical axis, reducing the maximum amplitude of the initial gradient waveform in a second logical axis, wherein the area demand in the first logical axis is greater than the area demand in the second logical axis, converting the gradient waveforms to physical gradient waveforms, and driving physical amplifiers of an imaging system with the physical gradient waveforms during a scan. In this way, oblique scans may be performed without a performance reduction caused by increases in echo time, repetition time, and echo spacing.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 4 shows a set of graphs illustrating change of amplitudes from orthogonal to oblique imaging plane according to an exemplary embodiment;

FIG. 5 shows a set of graphs illustrating optimized pulse amplitudes in an oblique imaging plane according to an exemplary embodiment;

DETAILED DESCRIPTION

Figure 2:
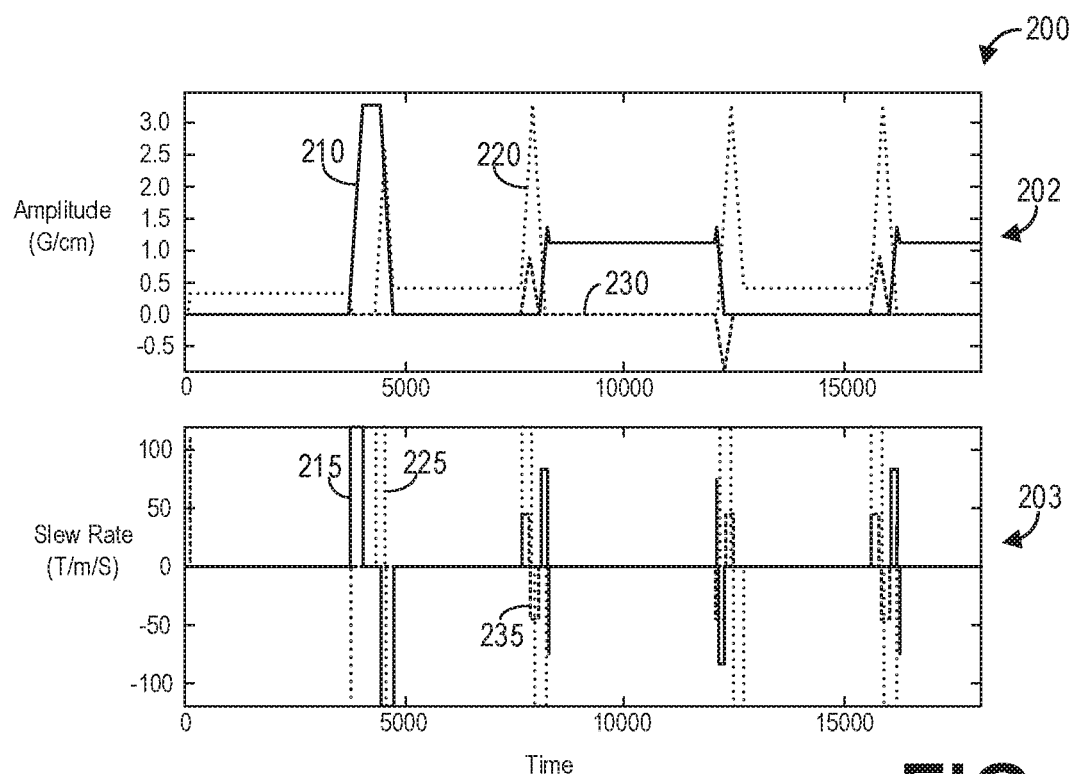
FIG. 2 shows a set of graphs illustrating example waveforms for an axial imaging plane.
Figure 3:
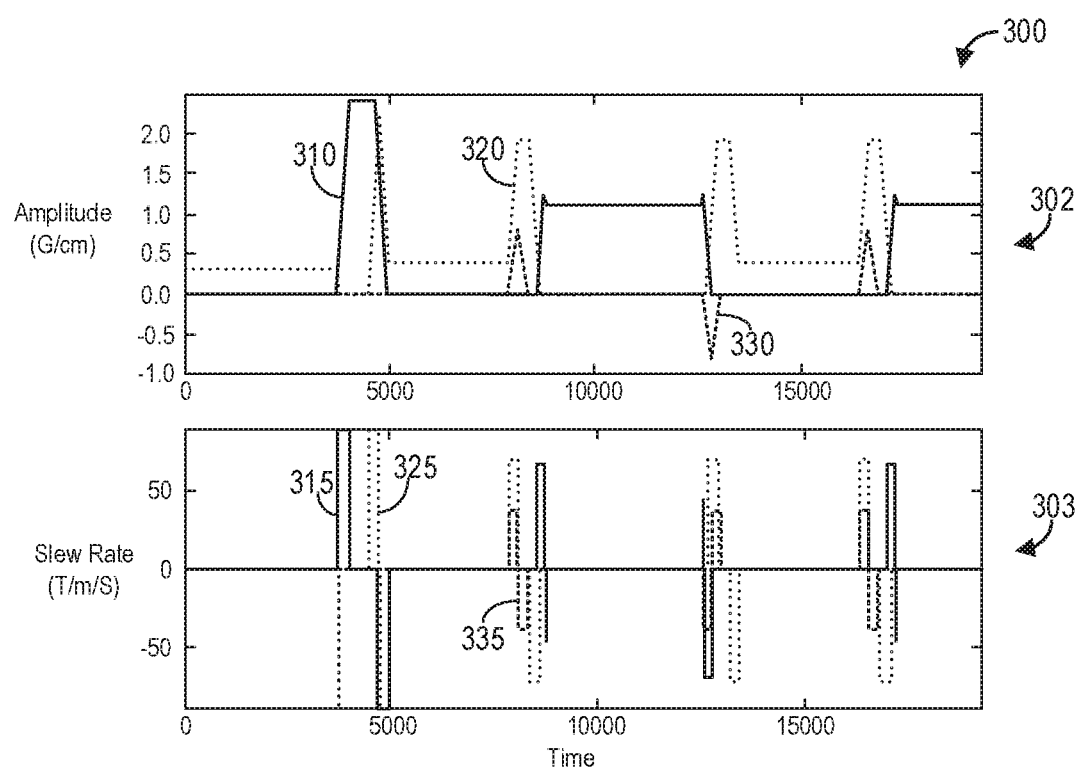
FIG. 3 shows a set of graphs illustrating example waveforms for an oblique imaging plane.

The following description relates to various systems and methods for optimizing gradient waveforms in MRI systems. In particular, methods are provided for optimizing gradient waveforms in an MRI system, such as the MRI system depicted in FIG. 1. Scan parameters that characterize gradient waveforms, such as echo spacing, echo time, and repetition time, may increase for oblique imaging planes compared to orthogonal imaging planes, as depicted in FIGS. 2 and 3, which reduces imaging performance for oblique scans. For oblique views, the amplitudes of different gradient waveforms are reduced, as illustrated in FIG. 4, because components of multiple gradients are generated by a single gradient amplifier. The amplitude and pulse widths of gradient waveforms may be optimized, as illustrated in FIG. 5, for oblique views. The amplitudes of the gradient waveforms may be optimized according to the angle between the logical axes of the gradient waveforms and the physical axes of the gradient amplifiers or coils, as depicted in FIGS. 6-9. Example iterative optimizations of gradient waveforms are depicted in FIGS. 10-19. An example method for oblique imaging, such as the method depicted in FIG. 20, includes optimizing waveforms in the logical axes according to area demand, and converting the optimized waveforms to physical gradient waveforms for driving the gradient amplifiers. A method for optimizing waveforms, such as the method depicted in FIG. 21, includes adjusting amplitudes and slew rates for waveforms. Optimizing gradient waveforms according to the methods described herein in turn optimizes the scan parameters, as depicted in FIG. 22, such that oblique imaging may be performed without a loss in performance.

Figure 1:
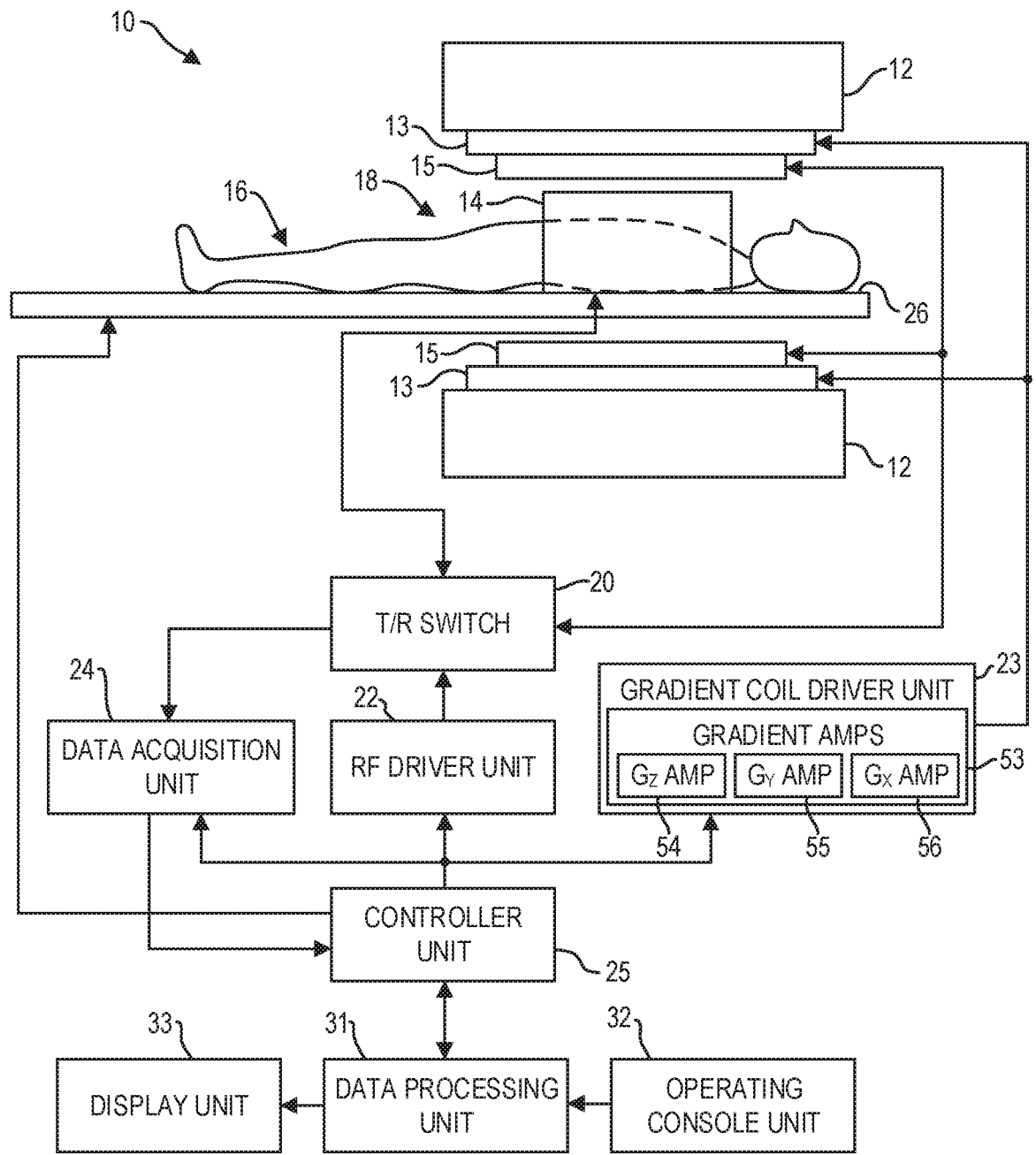
FIG. 1 is a block diagram of an MRI system according to an exemplary embodiment.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of a slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes the gradient coil unit 13 that generates a gradient magnetic field in the imaging space 18 so as to provide the MR signals received by the RF coil unit 14 with three-dimensional positional information. The gradient coil unit 13 includes three gradient coil systems, each of which generates a gradient magnetic field which includes into one of three spatial axes perpendicular to each other, and generates a gradient field in each frequency-encoding direction, phase-encoding direction, and slice-selection direction in accordance with the imaging condition. More specifically, the gradient coil unit 13 applies a gradient field in the slice-selection direction of the subject 16, to select the slice; and the RF coil unit 14 transmits an RF pulse to a selected slice of the subject 16 and excites it. The gradient coil unit 13 also applies a gradient field in the phase-encoding direction of the subject 16 to phase encode the MR signals from the slice excited by the RF pulse. The gradient coil unit 13 then applies a gradient field in the frequency-encoding direction of the subject 16 to frequency encode the MR signals from the slice excited by the RF pulse.

The RF coil unit 14 is disposed, for example, to enclose the region to be imaged of the subject 16. In the static magnetic field space or imaging space 18 where a static magnetic field $B_0$ is formed by the magnetostatic field magnet unit 12, the RF coil unit 14 transmits, based on a control signal from the controller unit 25, an RF pulse that is an electromagnetic wave to the subject 16 and thereby generates a high-frequency magnetic field $B_1$. This excites a spin of protons in the slice to be imaged of the subject 16. The RF coil unit 14 receives, as an MR signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MRI apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject 16. For a transmit-receive local coil, the local coil provides the RF excitation to the region of interest and receives the MR signal, thereby decreasing the RF power deposited in the subject 16. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in a receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14 or the RF body coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits or gradient amplifiers 53 corresponding to the three gradient coil systems included in the gradient coil unit 13. As depicted, the gradient amplifiers 53 include a $G_z$ amplifier 54 for the gradient in a z direction, a $G_y$ amplifier 55 for the gradient in a y direction, and a $G_x$ amplifier 56 for the gradient in an x direction.

The data acquisition unit 24 includes a preamplifier (not shown), a phase detector (not shown), and an analog/digital converter (not shown) used to acquire the MR signals received by the RF coil unit 14. In the data acquisition unit 24, the phase detector phase detects, using the output from the RF oscillator of the RF driver unit 22 as a reference signal, the MR signals received from the RF coil unit 14 and amplified by the preamplifier, and outputs the phase-detected analog MR signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as, as non-limiting examples, a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform pre-determined data processing is recorded. The data processing unit 31 is connected to the controller unit 25 and performs data processing based on control signals received from the controller unit 25. The data processing unit 31 is also connected to the data acquisition unit 24 and generates spectrum data by applying various imaging processing operations to the MR signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

The gradient fields may be considered to be oriented both in physical planes, as well as by logical axes. In the physical sense, the fields are mutually orthogonally oriented to form a coordinate system which can be rotated by appropriate manipulation of the pulsed current applied to the individual field coils. In a logical sense, the coordinate system defines gradients which are typically referred to as slice selection gradients, frequency encoding gradients, and phase encoding gradients.

The slice selection gradient determines a slab of tissue or anatomy to be imaged in the patient. The slice selection gradient field may thus be applied simultaneously with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis, also known as the readout gradient axis, is applied in a direction perpendicular to the slice selection gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encoding gradient is generally applied in a sequence before the readout gradient and after the slice selection gradient. Localization of spins in the gyromagnetic material in the phase encoding direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encoding gradient permits phase differences to be created among the spins of the material in accordance with their position in the phase encode direction.

The physical gradients generated by the gradient coil unit 13 driven by the amplifiers 53 may be configured with respect to the imaging system such that, when imaging in the axial, sagittal, and coronal reference planes, the physical gradients align with the logical axes. For example, the $G_Z$ amplifier 54 may be used for generating the slice selection gradient, the $G_Y$ amplifier 55 may be used for generating the phase encoding gradient, and the $G_X$ amplifier 56 may be used for generating the frequency encoding gradient for axial, coronal, or sagittal imaging. In this way, the shortest scan parameters (e.g., echo time (TE), repetition time (TR), and echo spacing (ESP)) are achieved for axial, sagittal, and coronal prescriptions.

However, when oblique scans are prescribed, these scan parameters get longer, which leads to reduced application performance for oblique scans. As an illustrative example, FIG. 2 shows a set of graphs 200 illustrating example waveforms for an axial imaging plane, including a graph 202 of waveform amplitude and a graph 203 of waveform slew rate over time. In particular, the graph 202 depicts the $G_X$ waveform amplitude 210, the $G_Z$ waveform amplitude 220, and the $G_Y$ waveform amplitude 230, while the graph 203 depicts the corresponding $G_X$ waveform slew rate 215, the $G_Z$ waveform slew rate 225, and the $G_Y$ waveform slew rate 235.

In contrast, FIG. 3 shows a set of graphs 300 illustrating example waveforms for an oblique imaging plane, including a graph 302 of waveform amplitude and a graph 303 of waveform slew rate over time. The graph 302 of waveform amplitude depicts the $G_X$ waveform amplitude 310, the $G_Z$ waveform amplitude 320, and the $G_Y$ waveform amplitude 330, while the graph 303 depicts the corresponding $G_X$ waveform slew rate 315, the $G_Z$ waveform slew rate 325, and the $G_Y$ waveform slew rate 335.

As depicted in FIGS. 2 and 3, the maximum value of the $G_X$ waveform amplitude 310 is reduced in comparison to the maximum value of the $G_X$ waveform amplitude 210. Furthermore, the pulse duration of the $G_X$ waveform amplitude 310 is substantially longer than the $G_X$ waveform amplitude 210 for the axial imaging plane. Due to the relatively longer scan parameters such as TE, TR, and ESP, as well as relatively reduced amplitudes for oblique scans, the application performance is in general reduced for oblique scans in comparison to the orthogonal imaging planes.

FIG. 4 shows a set of graphs 400 illustrating example pulse amplitudes in two logical axes for orthogonal and oblique imaging planes. The set of graphs 400 includes a schematic diagram 401 of maximum values of amplitudes in logical axes X and Y for orthogonal and oblique pulses, a graph 402 of the amplitude of an axial pulse 410 and an oblique pulse 420 in a logical axis X, as well as a graph 403 of the amplitude of an axial pulse 430 and an oblique pulse 440 in a logical axis Y orthogonal to the logical axis X.

For an orthogonal imaging plane, such as an axial, sagittal, or coronal imaging plane, the axial pulse 410 generated by a $G_X$ coil driven by a $G_X$ amplifier (e.g., $G_X$ amplifier 56) and the axial pulse 430 generated by a $G_Y$ coil driven by a $G_Y$ amplifier (e.g., $G_Y$ amplifier 55) may be allocated the maximum amplitude possible, as the logical axis X and the logical axis Y align with the physical axis X and the physical axis Y of the gradient coils. In particular, the pulse 410 may reach the maximum amplitude 412 achievable by the $G_X$ amplifier, while the pulse 430 may reach the maximum amplitude 432 achievable by the $G_Y$ amplifier. Both the amplitude 412 and the amplitude 432 are achievable even though the first axial pulse 410 and the second axial pulse 430 are time-aligned.

In an oblique plane, the logical axes X and Y rotate an angle α relative to the logical axes of axial plane, as shown in diagram 401. The $G_X$ coil may contribute to a portion of the waveform in the logical axis X and a portion of the waveform in logical axis Y (will be described below in detail with reference to FIG. 6). To ensure that the combination of the waveforms in the logical axes X and Y does not exceed the maximum amplitude achievable by the $G_X$ and $G_Y$ amplifiers, the maximum values of waveform amplitudes in logical axes X and Y for the oblique pulses are reduced. In particular, as shown in diagram 401, the square formed by the maximum values 422 and 442 of waveform amplitudes in logical axes X and Y for the oblique plane is confined within the square formed by the maximum values 412 and 432 of waveform amplitudes in the physical axes. Therefore, the maximum amplitude 422 that the oblique pulse 420 can achieve in the logical axis X is smaller than the maximum amplitude 412 in the physical axis X, and the maximum amplitude 442 that the oblique pulse 440 can achieve in the logical axis Y is smaller than the maximum amplitude 432 in the physical axis Y. If the area enclosed by the pulse remains the same, the duration (i.e., width) of the pulse for oblique scan is longer that the duration of the pulse for orthogonal scan. In particular, the duration of the pulse 420 is longer than that of the pulse 410, and the duration of the pulse 440 is longer than that of the pulse 430, as shown in graphs 402 and 403.

Although the two logical axes X and Y are depicted in FIG. 4 for simplicity, it should be appreciated that in practice three logical axes X, Y, and Z may be used. If three logical axes are used, the squares shown in diagram 401 can be changed to cubes, for example.

Thus, as illustrated by FIGS. 2-4, the maximum logical amplitudes are reduced and scan parameters (e.g., echo time (TE), repetition time (TR), and echo spacing (ESP)) are increased when oblique scan is prescribed. For some applications, pulses in different logical axes start at the same time and have the same area demand. For example, in an application, two "crushers" with the same area demand at the same time on different logical axes are used to kill the signal at the end of each TR period. For other applications, the area demand of overlapping pulses and/or the starting time of overlapping pulses may be different for different logical axes. The area demand of each gradient waveform waveforms may depend on the prescription. For example, if the resolution in one direction is changed, the area demand of the corresponding waveform would change accordingly. Therefore, even for the same pulse sequence diagram (PSD), one prescription might require pulses in different logical axes start at the same time and have same area demand while for another prescription (e.g., with lower resolution along one direction), the area demand of overlapping pulses may be different.

For those applications where the area demands of overlapping pulses and/or the starting times of overlapping pulses are different, pulse optimization may be performed. As an illustrative example, FIG. 5 shows a set of graphs 500 illustrating the optimization of pulse amplitudes in an oblique imaging plane according to an embodiment. The set of graphs 500 includes a graph 502 of the amplitude of a first un-optimized oblique pulse 510 and a first optimized oblique pulse 520 in a logical axis X, as well as a graph 503 of the amplitude of a second un-optimized oblique pulse 530 and a second optimized oblique pulse 540 in a logical axis Y.

In the logical axis X, the first un-optimized oblique pulse 510 has an amplitude 512 and a pulse width (i.e., duration) 514, wherein the amplitude 512 is less than the maximum achievable amplitude 522 in the physical axis X. Meanwhile in the logical axis Y, the second un-optimized oblique pulse 530 has an amplitude 532 and a pulse width 534. As depicted, there is a high area demand on the logical axis X and a low area demand on the logical axis Y.

To optimize the first un-optimized oblique pulse 510 and the second un-optimized oblique pulse 530, the slew rate and the amplitude may be increased in the logical axis X while the amplitude and slew rate may be reduced or derated in the logical axis Y. As a result, the first optimized oblique pulse 520 has an amplitude 522 equal to the maximum amplitude achievable in the physical axis X, with a pulse width 524 reduced with respect to the pulse width 514 due to the increased slew rate. The second optimized oblique pulse 540 has an amplitude 542 lower than the amplitude 532 and especially lower than the maximum amplitude 550 achievable in the physical axis Y, while the pulse width 544 is increased relative to the pulse width 534 due to the derating.

Thus, optimizing the pulses 510 and 530 in this example to generate the optimized pulses 520 and 540 includes derating in the logical axis Y so that the slew rate may be increased in the logical axis X, and calculating a maximum amplitude achievable in the logical axis X based on the derated amplitude in the logical axis Y.

Figure 6:
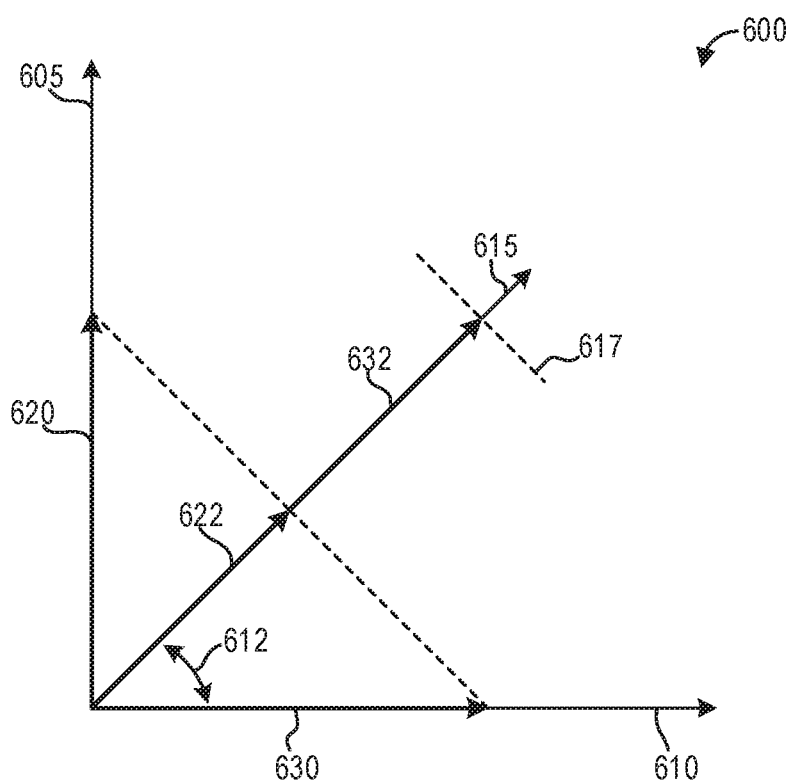
FIG. 6 shows a graph illustrating waveform components of gradient waveforms in logical axes along a physical axis where the physical gradient is utilized at the maximum specifications for oblique scans.

FIG. 6 shows a graph 600 illustrating waveform components of gradient waveforms in logical axes along a physical axis. In particular, the graph 600 depicts a first logical axis 605 (e.g., the logical axis Y) and a second logical axis 610 (e.g., the logical axis X) rotated by an angle 612 with respect to a physical axis 615 (e.g., the physical axis X).

The gradient amplifier associated with the physical axis 615 has an output capacity depicted as the maximum amplitude 617 along the physical axis 615.

Graph 600 depicts a first waveform with an amplitude 620 along the first logical axis 605 and a second waveform with an amplitude 630 along the second logical axis 610. As the logical axis 610 is rotated with respect to the physical axis 615 by the angle 612, gradient generated along the physical axis 615 contributes to a portion of the waveform in the first logical axis 605 and a portion of the waveform in the second logical axis 610. Initially, the amplitudes 620 and 630 are allocated to the respective waveforms such that the component 622 of the first waveform and the component 632 of the second waveform are equal and fully utilize the capacity of the gradient amplifier as indicated by the maximum amplitude 617. For example, the amplitudes 620 and 630 may be initially determined according to diagram 401 of FIG. 4.

As a high area demand is depicted in both logical axes 605 and 610 by the amplitudes 620 and 630, respectively, the physical gradients are utilized at their maximum specifications for oblique scans.

Figure 7:
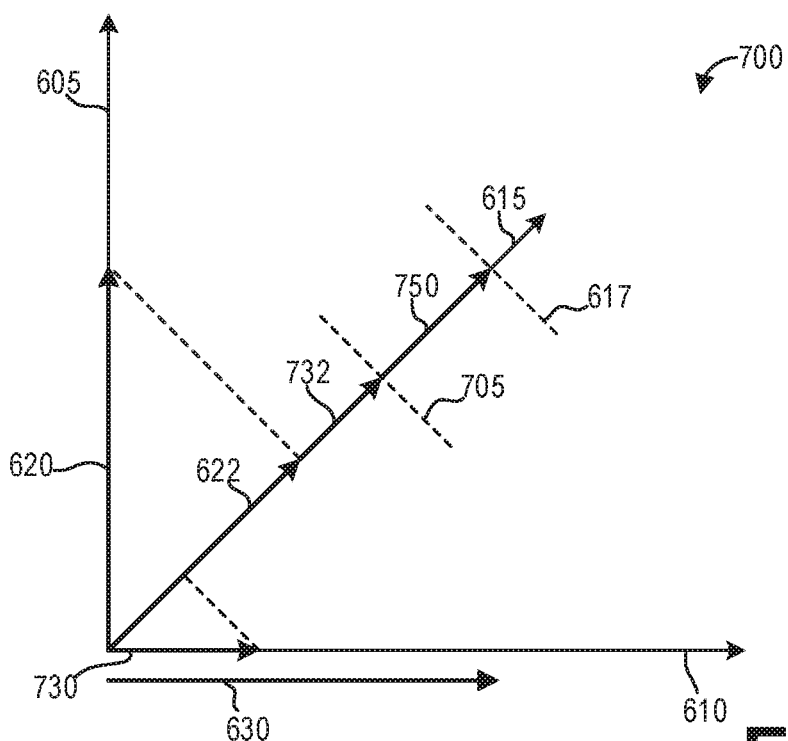
FIG. 7 shows a graph illustrating an example optimization of the waveform components of the gradient waveforms along the physical axis where the physical gradient is not utilized at the maximum specifications for oblique scans according to an embodiment.
Figure 8:
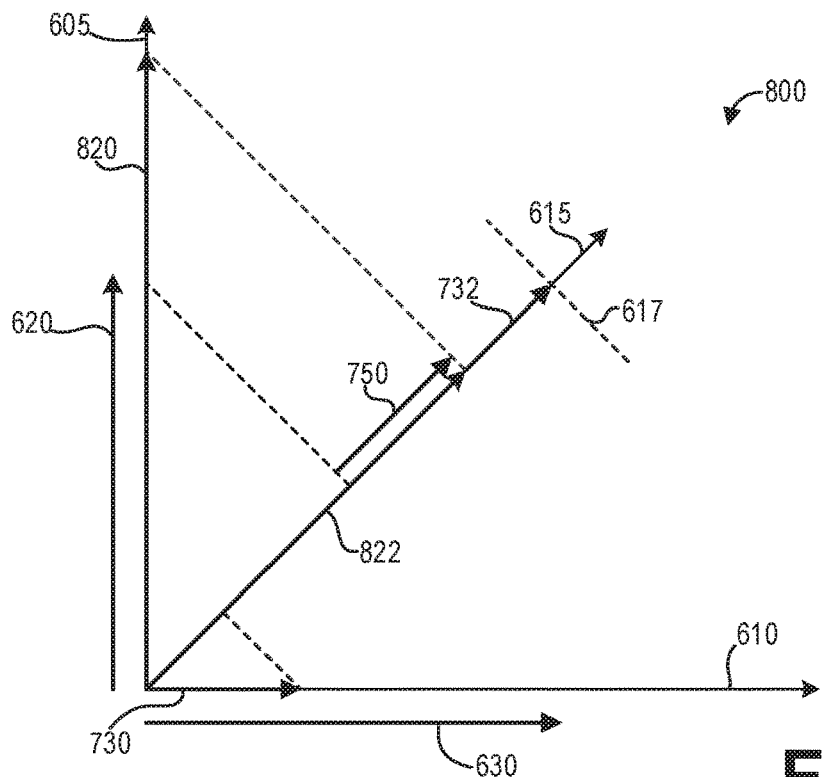
FIG. 8 shows a graph illustrating an example optimization of the waveform components of the gradient waveforms where the unused capacity of physical gradient as shown in FIG. 7 is used.

FIG. 7 shows a graph 700 illustrating that, if there is a low area demand in one of the logical axes, then the gradient generated along the physical axis 615 is not utilized at its maximum specification for oblique scans. For example, if the demand for the second waveform corresponds to an amplitude 730 rather than the amplitude 630, then the component 732 of the amplitude 630 is similarly smaller. As the total demand 705 on the physical axis 615 is less than the maximum amplitude 617, there is an unused capacity 750 along the physical axis 615.

As the demand along the first logical axis 605 as depicted by the amplitude 620 is greater than the demand along the second logical axis 610 as depicted by the amplitude 730, the amplitude of the first waveform may be increased to utilized the unused capacity 750 of the physical axis 615. For example, as depicted by the graph 800 in FIG. 8, the amplitude of the first waveform in the first logical axis 605 is increased from the amplitude 620 to the optimized amplitude 820 in order to maximize the utilization of the amplifier in the physical axis 615. The waveform component 822 of the first waveform along the physical axis 615 is thus increased to utilize the unused capacity 750, such that the total demand on the physical axis 615 is equal to the maximum amplitude 617.

Figure 9:
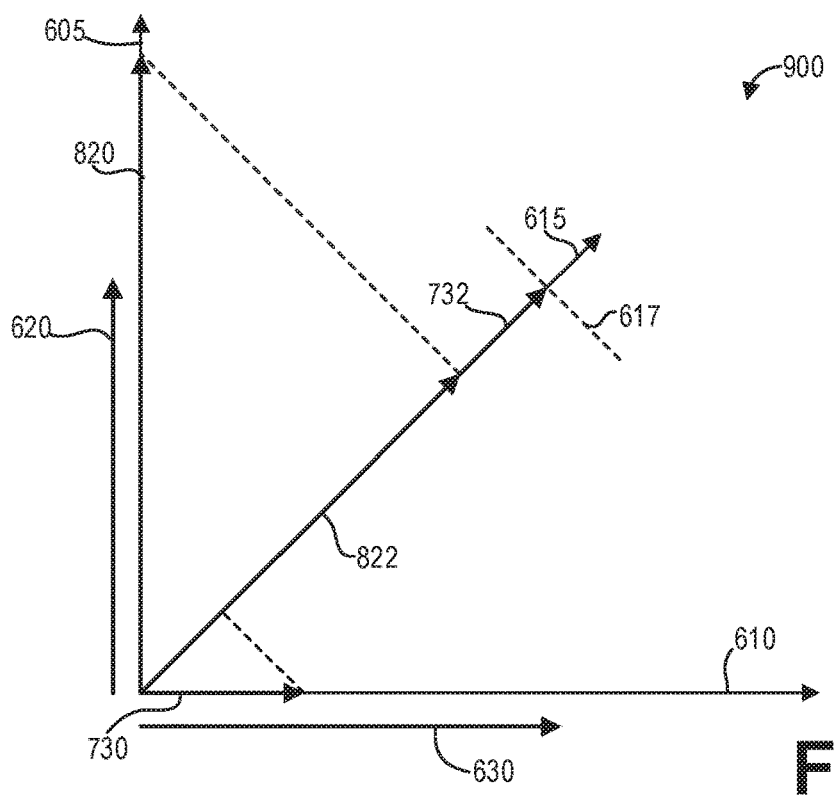
FIG. 9 shows a graph illustrating an example of waveform components of the gradient waveforms along the physical axis optimized as shown in FIG. 8.

Thus, as depicted by graph 900 in FIG. 9, the amplitude 820 of the first waveform is increased to account for the lower amplitude 730 of the second waveform, and the components 822 and 732 of the first and second waveforms respectively along the physical axis 615 add up to the maximum amplitude 617 of the physical axis 615. Although FIGS. 6-9 describe two physical axes and two logical axes for simplicity of discussion, it should be appreciated that optimization of waveform amplitudes for three physical axes (i.e., a physical axis X, a physical axis Y, and a physical axis Z) as well as three logical axes (i.e., a logical axis X, a logical axis Y, and a logical axis Z) can be performed similarly.

The relationship between the logical gradient waveforms and the physical gradient waveforms can be expressed as:

$$\begin{bmatrix} G_{phyX} \\ G_{phyY} \\ G_{phyZ} \end{bmatrix} = R \begin{bmatrix} G_{logicX} \\ G_{logicY} \\ G_{logicZ} \end{bmatrix},$$

where $G_{phyX}$, $G_{phyY}$, and $G_{phyZ}$ are the gradient waveforms in physical axes, $G_{logicX}$, $G_{logicY}$, and $G_{logicZ}$ are the gradient waveforms in logical axes, and R is the 3×3 rotation matrix. Elements of the rotation matrix are determined by the slice orientation, as well known in the art.

Upon evaluation of the gradient area demand in each logical axis, the first logical axis X demands $G_{logicDemX}$, the second logical axis Y demands $G_{logicDemY}$ and the third logical axis Z demands $G_{logicDemZ}$ can be determined. When PSDs are designed, the area demand of each gradient waveform and where to place each waveform in the playout can be known. The amplitude demand from each physical axis can be calculated using the rotation matrix:

$$\begin{bmatrix} G_{phyDemX} \\ G_{phyDemY} \\ G_{phyDemZ} \end{bmatrix} = R \begin{bmatrix} G_{logicDemX} \\ G_{logicDemY} \\ G_{logicDemZ} \end{bmatrix},$$

where $G_{phyDemX}$, $G_{phyDemY}$, and $G_{phyDemZ}$ are the amplitude demands from physical X, Y and Z axes, respectively. Using these amplitude demands from each physical axis, three scale factors, scaleX, scaleY and scaleZ, can be calculated by dividing the amplitude demand from each physical axis by the maximum amplitude that each physical axis can provide. A final scale factor scaleXYZ is obtained by taking the maximum of all the scale factors:

$$scaleXYZ = \max\left\{ \frac{G_{phyDemX}}{G_{phyMaxX}}, \frac{G_{phyDemY}}{G_{phyMaxY}}, \frac{G_{phyDemZ}}{G_{phyMaxZ}} \right\}.$$

This common scale factor, scaleXYZ, ensures that gradient amplitude on each physical axis does not exceed the gradient amplifier capability after optimization. Finally, the optimized gradient amplitudes on logical axes can be calculated using the equation:

$$\begin{bmatrix} G_{logicOptX} \\ G_{logicOptY} \\ G_{logicOptZ} \end{bmatrix} = \frac{1}{scaleXYZ} \begin{bmatrix} G_{logicDemX} \\ G_{logicDemY} \\ G_{logicDemZ} \end{bmatrix},$$

where $G_{logicOptX}$, $G_{logicOptY}$, and $G_{logicOptZ}$ are the optimized gradient waveform amplitudes in logical X, Y and Z axes, respectively.

Figure 10:
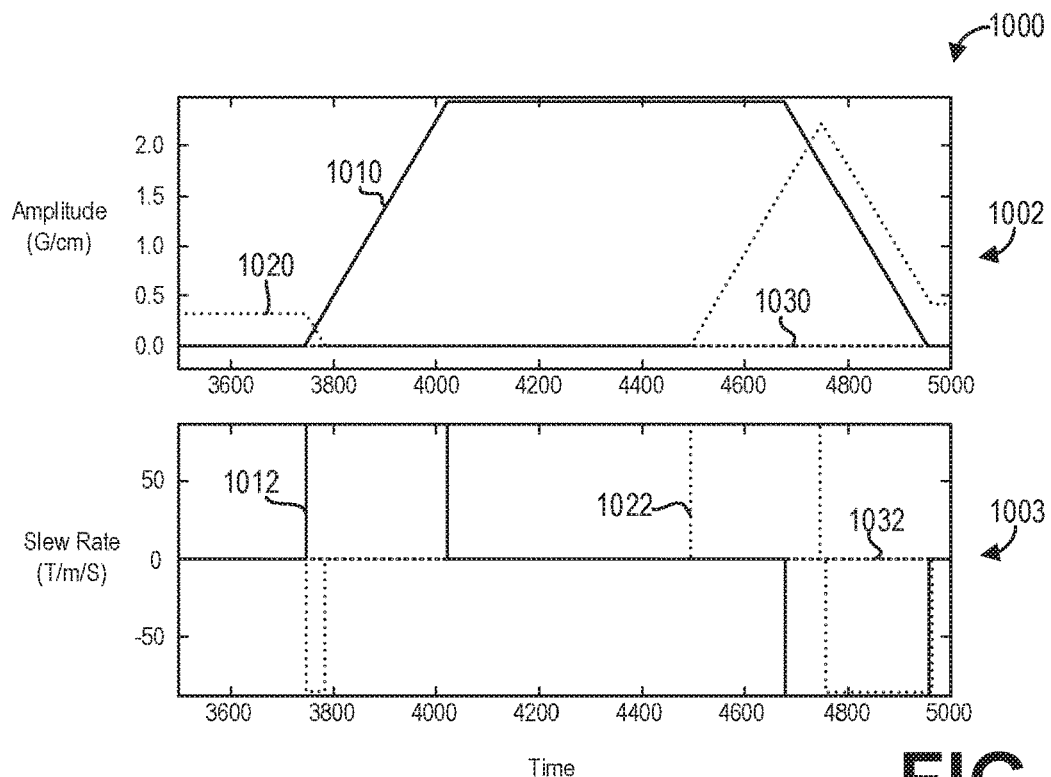
FIG. 10 shows a set of graphs illustrating un-optimized gradient waveforms.

FIG. 10 shows a set of graphs 1000 illustrating unoptimized gradient waveforms including a graph 1002 of amplitude over time for three gradient waveforms 1010, 1020, and 1030, as well as a graph 1003 of the slew rates 1012, 1022, and 1032 respectively corresponding to the gradient waveforms of graph 1002.

Figure 11:
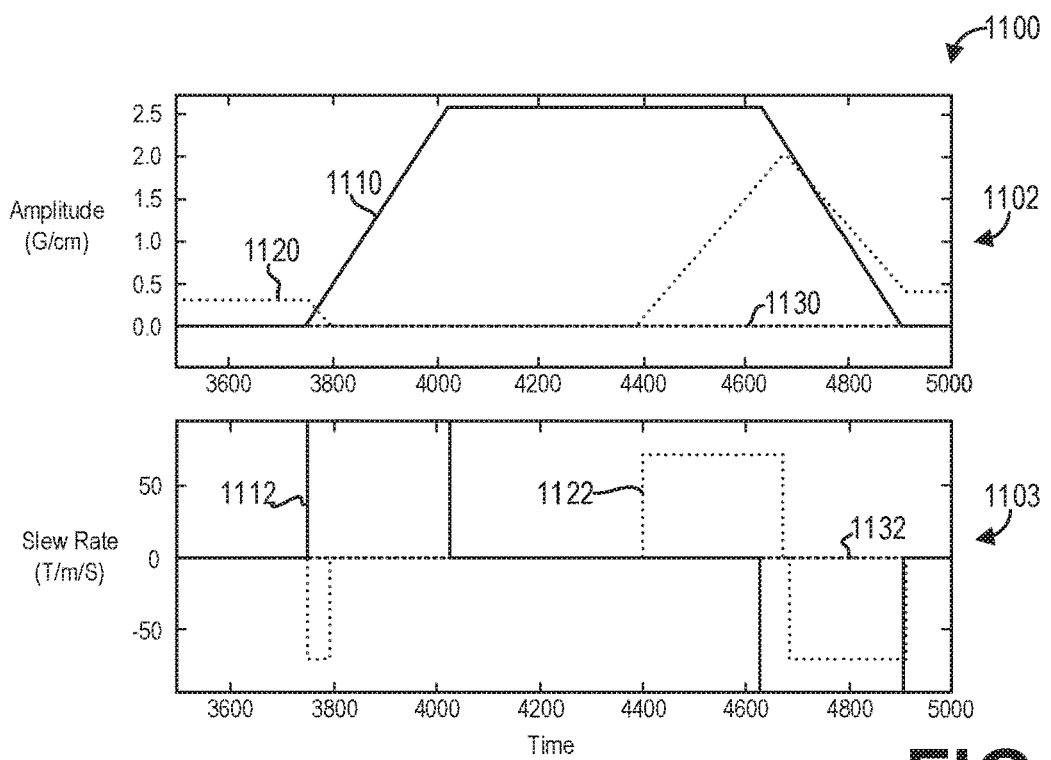
FIG. 11 shows a set of graphs illustrating the gradient waveforms of FIG. 10 after one iteration of optimization, according to an exemplary embodiment.
Figure 12:
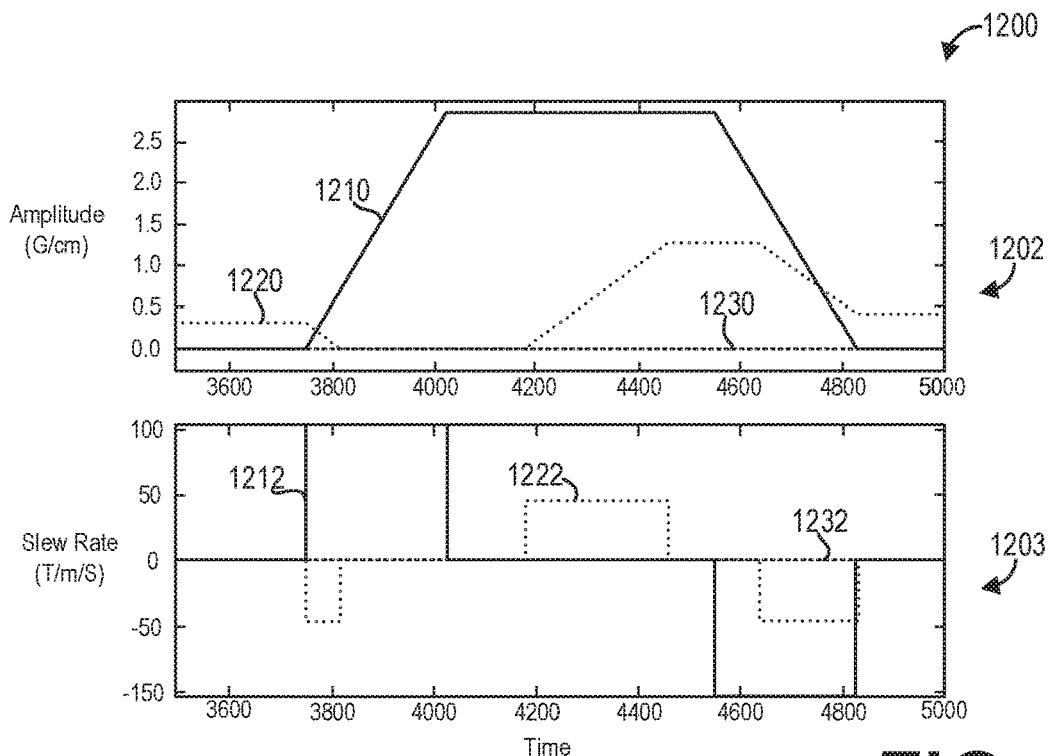
FIG. 12 shows a set of graphs illustrating the gradient waveforms of FIG. 10 after twenty iterations of optimization, according to an exemplary embodiment.
Figure 13:
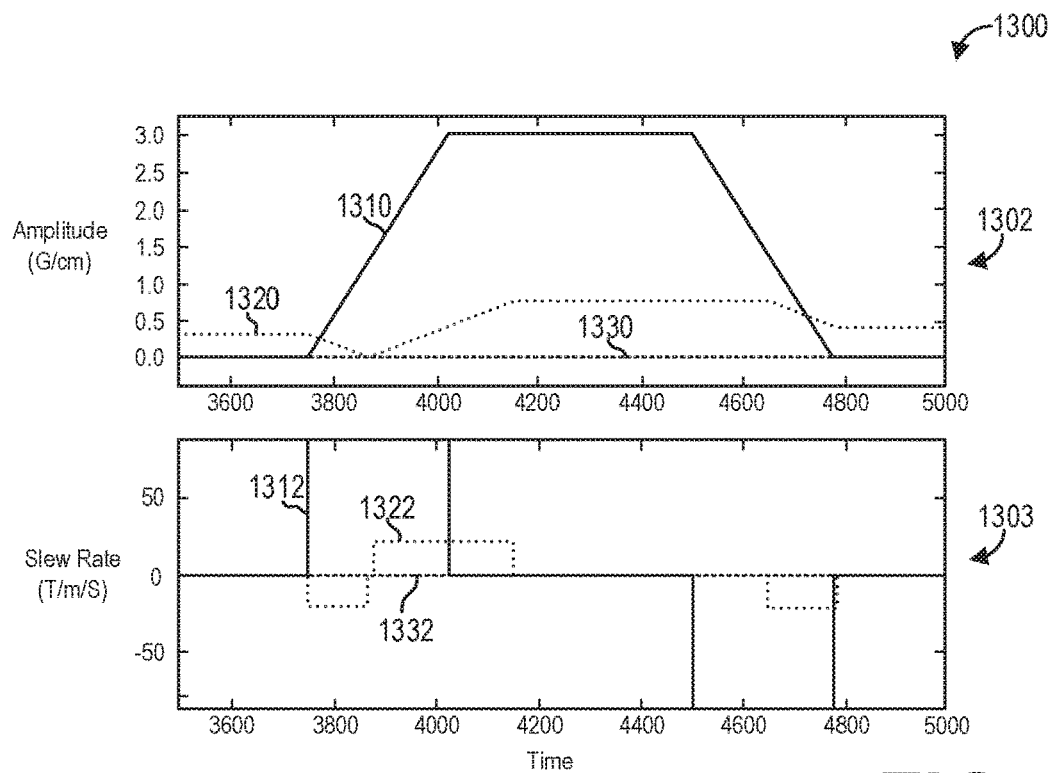
FIG. 13 shows a set of graphs illustrating the gradient waveforms of FIG. 10 after fifty iterations of optimization, according to an exemplary embodiment.

FIGS. 11-13 show a set of graphs illustrating iterative optimizations of the gradient waveforms of FIG. 10 according to an exemplary embodiment. The above equations show an analytical method. On the other hand, iterative method may be used where changes from the un-optimized waveform to the optimized waveform can be seen gradually. In particular, FIG. 11 shows a set of graphs 1100 including a graph 1102 and a graph 1103 illustrating amplitudes and skew rates after one iteration of optimization, respectively. As depicted, slew rate 1122 is reduced with respect to the slew rate 1022, and furthermore the amplitude of the pulse in the waveform 1120 is reduced with respect to the waveform 1020. The start time of the pulse in the waveform 1120 is also adjusted relative to the start time of the pulse in the waveform 1020 in order to adjust the overlapping area demands of the waveforms 1010 and 1020. As a result of the derating of the waveform 1020, the amplitude of the waveform 1110 is increased relative to the amplitude of the waveform 1010. Furthermore, the pulse width of the pulse of the waveform 1110 is reduced as the amplitude is increased, such that the area demand remains the same.

FIG. 12 shows a set of graphs 1200 including a graph 1202 and a graph 1203 respectively illustrating amplitudes 1210, 1220, and 1230, and slew rates 1212, 1222, and 1232 after twenty iterations of optimization. As depicted, the slew rate 1222 and the start time of the pulse of the second waveform 1220 is adjusted relative to the waveform 1120. Further, the amplitude of the waveform 1210 is increased to above 2.5 G/cm as the pulse width of the pulse in the waveform 1220 is increased.

FIG. 13 shows a set of graphs 1300 including a graph 1302 and a graph 1303 illustrating amplitudes and slew rates after fifty iterations of optimization, respectively. The amplitude of the first waveform 1310 reaches 3.0 G/cm, as depicted, which is a substantial amplitude increase compared to the un-optimized amplitude of 2.4 G/cm depicted in FIG. 10. The amplitude of the second waveform 1320 is substantially reduced relative to the second waveform 1020 depicted in FIG. 10, and the timing and slew rate 1322 has been substantially adjusted such that the area demand of the waveform 1320 is equivalent to the area demand of the waveform 1020.

As the waveform 1030 indicates no demand, the optimized waveforms 1130, 1230, and 1330 as well as the corresponding slew rates 1132, 1232, and 1332 can be unchanged relative to the initial waveform 1030 and corresponding slew rate 1032.

Figure 14:
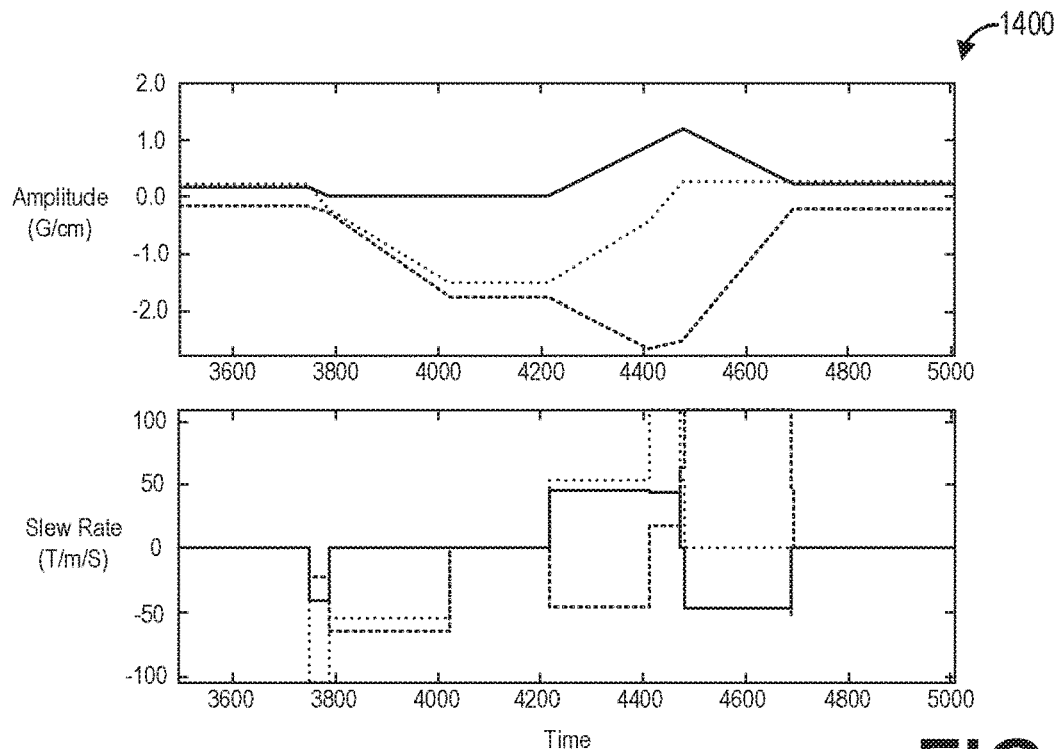
FIG. 14 shows a set of graphs illustrating un-optimized gradient waveforms.
Figure 15:
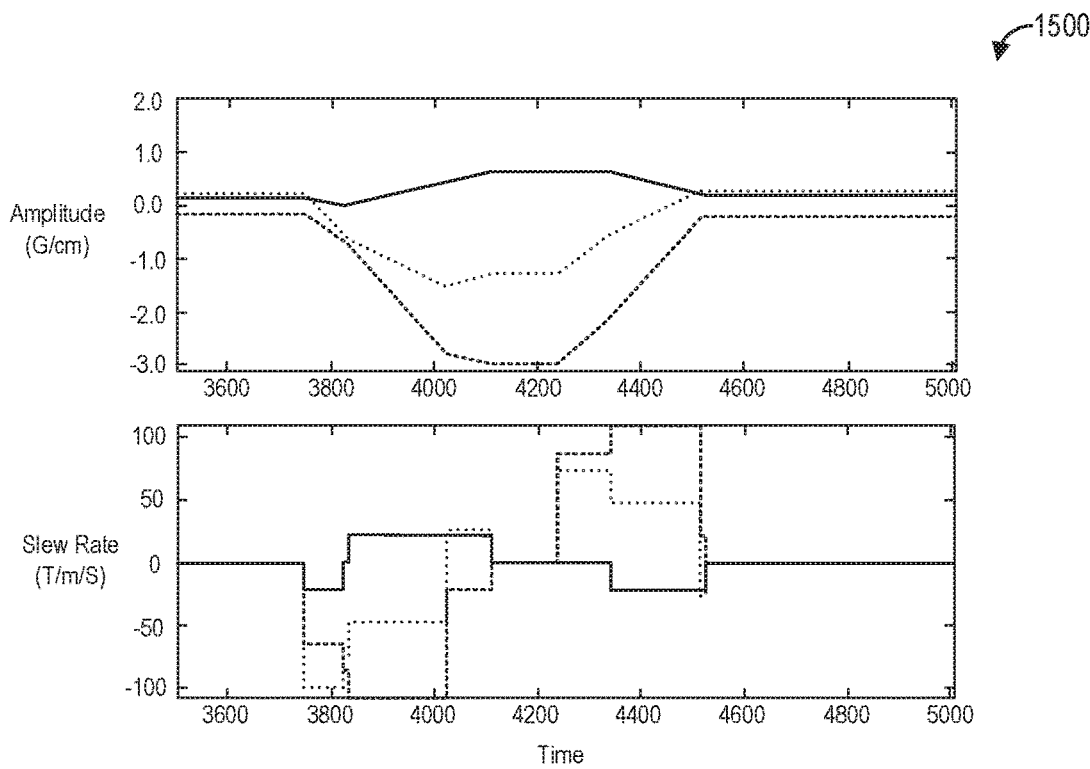
FIG. 15 shows a set of graphs illustrating the gradient waveforms of FIG. 14 after optimization according to an exemplary embodiment.

After optimization of the gradient waveforms in the logical axes according to demand, the waveforms are combined and converted into physical gradient waveforms for driving the individual gradient amplifiers. The physical gradient waveforms thus contribute to the optimized gradient waveforms from different logical axes. As an illustrative example, FIG. 14 shows a set of graphs 1400 illustrating un-optimized physical gradient waveforms while FIG. 15 shows a set of graphs 1500 illustrating the physical gradient waveforms of FIG. 14 after optimization. After optimization, the maximum amplitude and the maximum slew rates of the physical gradients are not violated.

Figure 16:
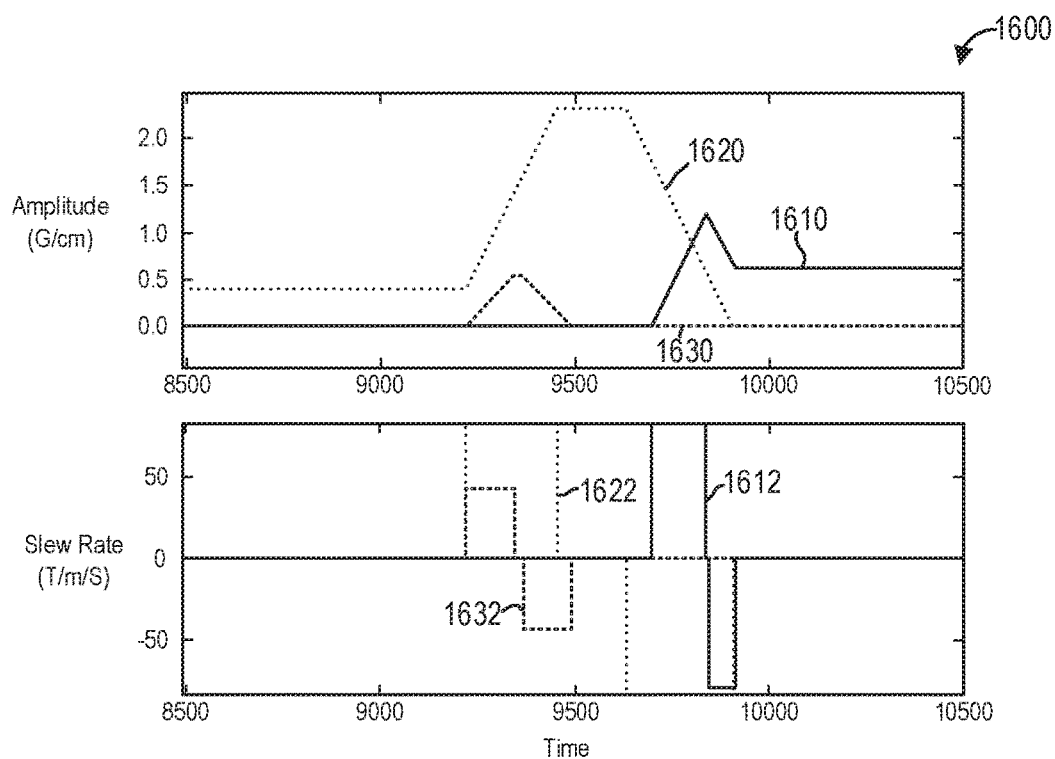
FIG. 16 shows a set of graphs illustrating un-optimized gradient waveforms.

In the optimization example depicted in FIGS. 10-13, the amplitude of the first waveform 1010 was optimally increased by derating the second waveform 1020 alone, as the third waveform 1030 indicated no demand. It should be understood that in many instances, all three gradient waveforms may be optimized or adjusted. As an example, FIG. 16 shows a set of graphs 1600 illustrating the amplitudes and slew rates of un-optimized gradient waveforms. The set of graphs 1600 in particular depict a pulse in each of the first waveform 1610, the second waveform 1620, and the third waveform 1630, and the corresponding slew rates 1612, 1622, and 1632. In this example, the area under the waveform 1620 (i.e., the area demand) is greater than the area under the waveforms 1610 and 1630, and so the waveform 1620 has the highest area demand.

Figure 17:
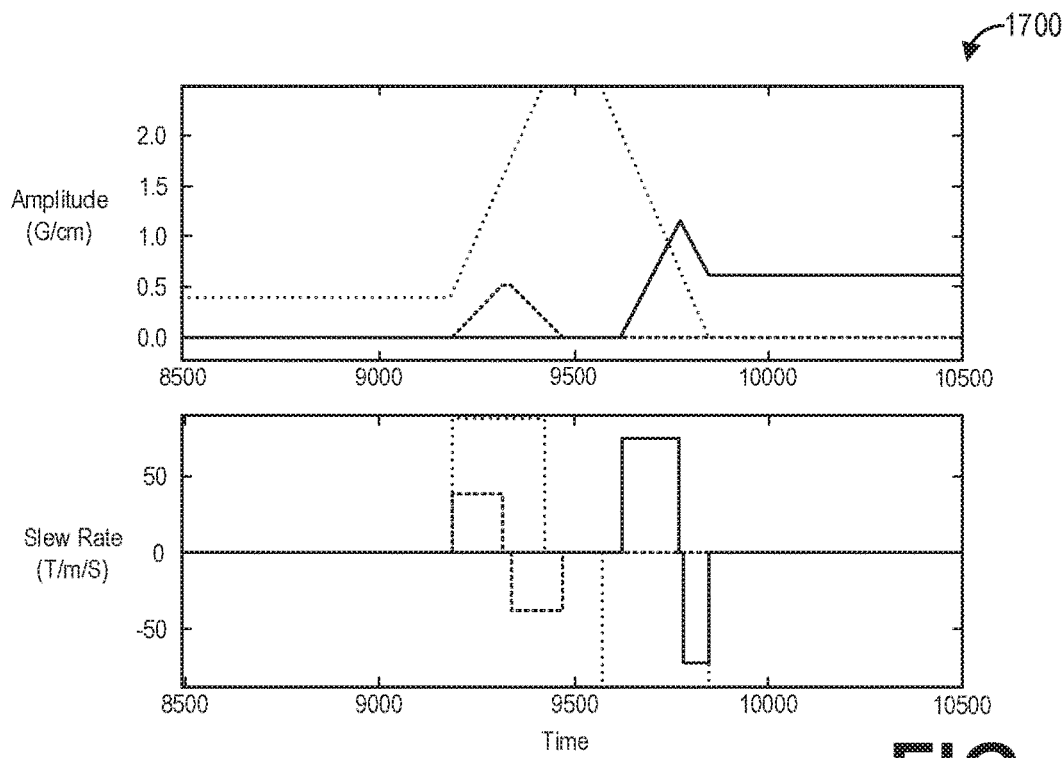
FIG. 17 shows a set of graphs illustrating the gradient waveforms of FIG. 16 after one iteration of optimization, according to an exemplary embodiment.
Figure 18:
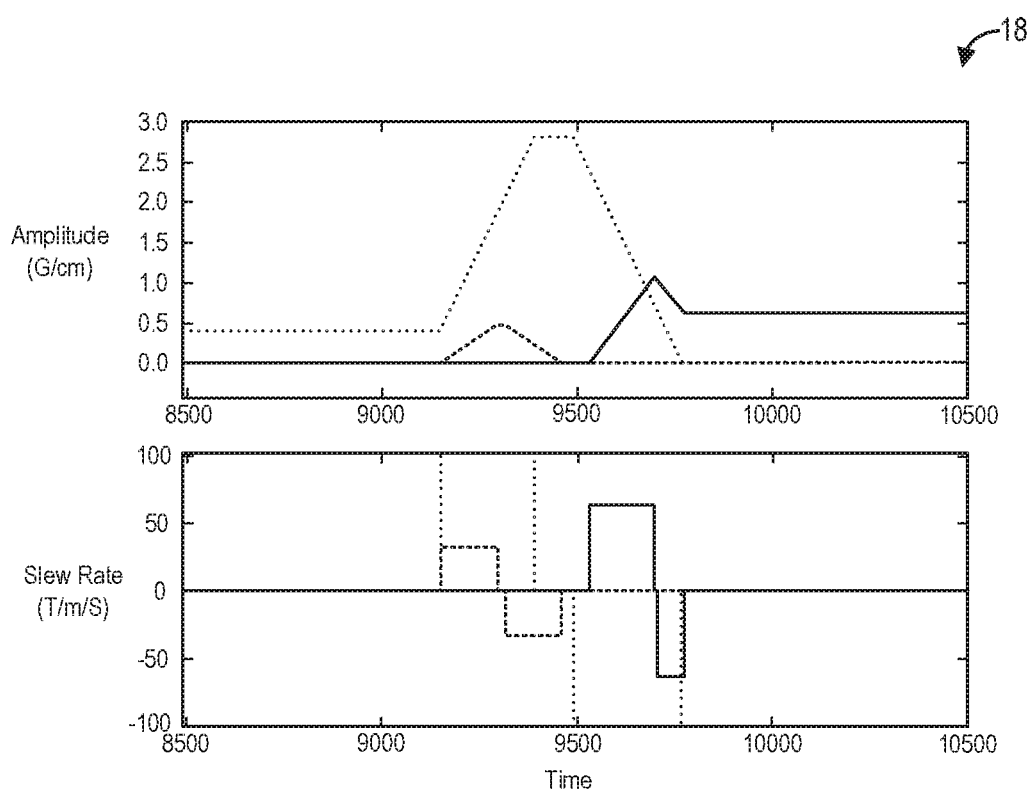
FIG. 18 shows a set of graphs illustrating the gradient waveforms of FIG. 16 after ten iterations of optimization, according to an exemplary embodiment.
Figure 19:
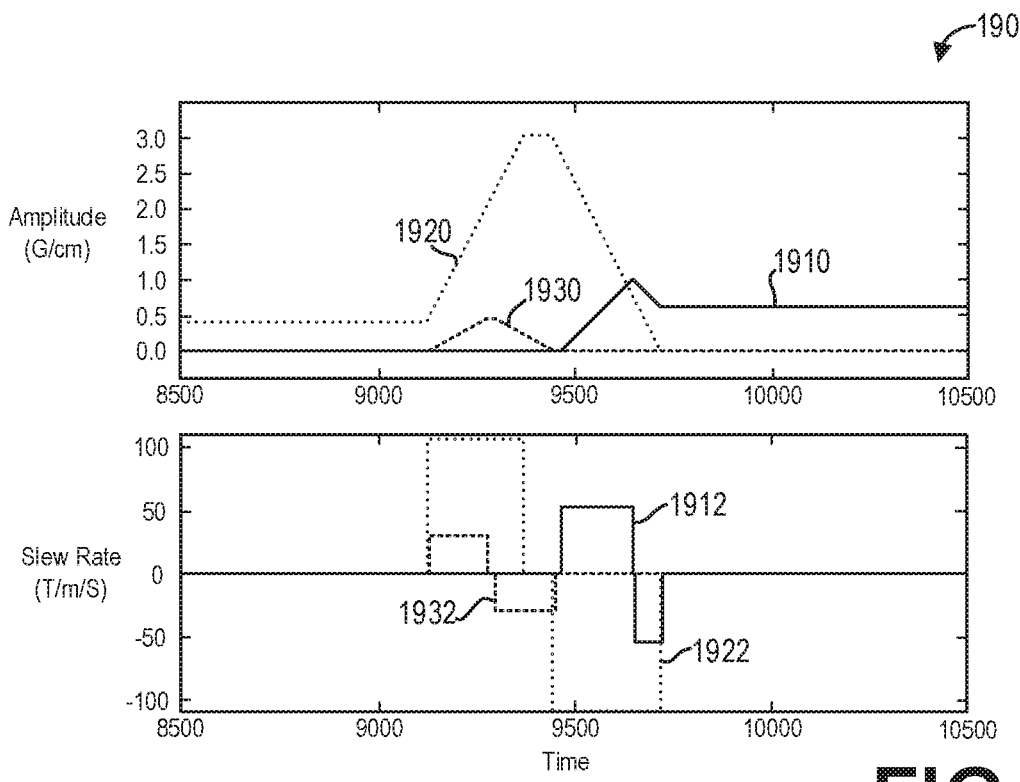
FIG. 19 shows a set of graphs illustrating the gradient waveforms of FIG. 16 after twenty-five iterations of optimization, according to an exemplary embodiment.

During optimization, the amplitude of the waveform 1620 and the corresponding slew rate 1622 may be increased to maximize the amplitude, while the waveforms 1610 and 1630 may be de-rated to accommodate the maximization of the waveform 1620. FIG. 17 shows a set of graphs 1700 illustrating the gradient waveforms of FIG. 16 after one iteration of optimization, while FIG. 18 shows a set of graphs 1800 illustrating the gradient waveforms of FIG. 16 after ten iterations of optimization. As depicted, the amplitude of the waveform 1620 is iteratively increased while the waveforms 1610 and 1630 are de-rated. FIG. 19 shows a set of graphs 1900 illustrating the gradient waveforms of FIG. 16 after twenty-five iterations of optimization. The amplitude of the optimized second waveform 1920 is 3.0 G/cm, substantially larger than the amplitude of 2.3 G/cm of the un-optimized second waveform 1620. The optimized slew rate 1922 of the optimized second waveform 1920 is also substantially increased relative to the slew rate 1622. Further, the amplitudes of the first optimized waveform 1910 and the third optimized waveform 1930 are substantially close to the amplitudes of the un-optimized waveforms 1610 and 1630. However, the timing of the pulses of the first optimized waveform 1910 and the third optimized waveform 1930 are adjusted relative to the un-optimized waveforms 1610 and 1630, and the slew rates 1912 and 1932 are substantially decreased relative to the slew rates 1612 and 1632. In this way, the area demand of the three waveforms is maintained while optimizing the amplitude of the waveform with the highest area demand.

Figure 20:
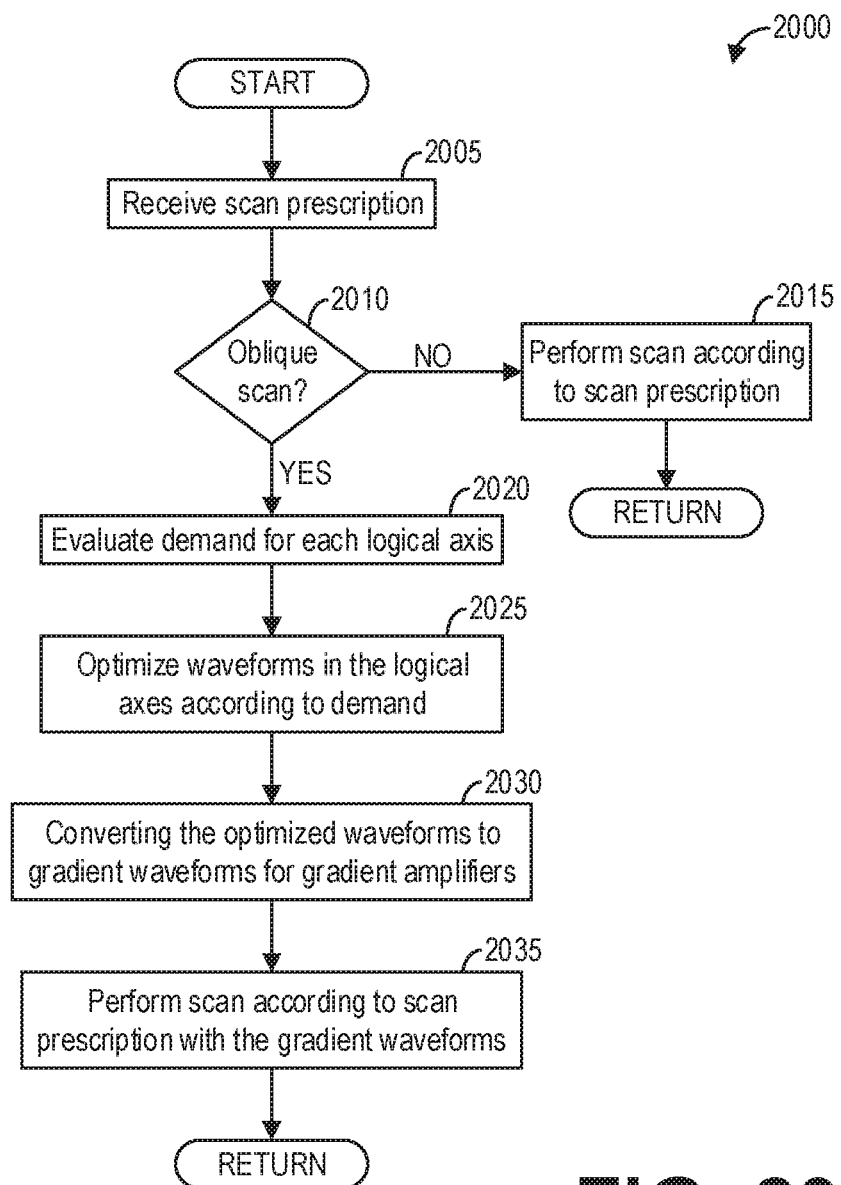
FIG. 20 shows a high-level flow chart illustrating an example method for performing oblique scans with optimized waveforms according to an embodiment.

FIG. 20 shows a high-level flow chart illustrating an example method 2000 for performing oblique scans with optimized waveforms according to an embodiment. Method 2000 is described with regard to the systems and components of FIG. 1, though it should be understood that the method 2000 may be implemented with other systems and components without departing from the scope of the present disclosure. Method 2000 may be implemented as executable instructions in non-transitory memory of the Mill apparatus 10, for example.

Method 2000 begins at 2005. At 2005, a scan prescription is received. The scan prescription may include user selections of one or more scan parameters, including but not limited to scan plane, resolution, pulse sequence, and so on.

At 2010, it is determined if the scan prescription prescribes an oblique scan. If the scan prescription does not include an oblique scan ("NO"), method 2000 proceeds to 2015, wherein a scan is performed according to the scan prescription. Gradient waveforms are generated according to the scan prescription with the selected scan parameters, and the gradient amplifiers are driven with the gradient waveforms to produce the gradient fields via the gradient coils as described hereinabove with regard to FIG. 1. Method 2000 then returns.

However, if the scan prescription includes an oblique scan ("YES" at 2010), method 2000 proceeds to 2020. At 2020, the area demand for each logical axis is evaluated. For example, the area demand may be evaluated based on the pulse sequence, resolution, etc. As discussed above, for different resolutions in one logical axis, the area demand of that logical axis may vary.

At 2025, the waveforms in the logical axes are optimized according to the demand. As discussed hereinabove, the amplitude and slew rate of the waveform with the highest area demand may be increased, while the amplitude, timing, and/or slew rate of one or more other waveforms are decreased such that area demand for each waveform is achieved. Furthermore, the physical constraints of the gradient amplifiers are respected by restraining the components of the logical gradient waveforms on the physical axes to the maximum amplitudes and slew rates. The optimized waveforms can be determined by analytical method (e.g., as shown by equations above) or by iterative method.

At 2030, the optimized waveforms are converted into physical gradient waveforms for the gradient amplifiers by using, for example, the rotation matrix. That is, the optimized waveforms in the logical axes are converted and combined into physical gradient waveforms along the physical axes, which will drive the corresponding gradient amplifiers. Despite adjusting the amplitudes and slew rates of the waveforms during the optimization, the physical gradient waveforms do not violate the maximum amplitude and slew rate of the gradient amplifiers. Continuing at 2035, a scan is performed according to the scan prescription with the physical gradient waveforms. That is, during the scan, the gradient amplifiers drive the gradient coils with the physical gradient waveforms. Method 2000 then returns.

Thus, a method for magnetic resonance imaging comprises optimizing gradient waveforms in logical axes, the logical axes rotated with respect to physical axes of gradient coils of the imaging system, and during a scan of a subject with the imaging system, controlling the gradient amplifiers with the optimized gradient waveforms.

Figure 21:
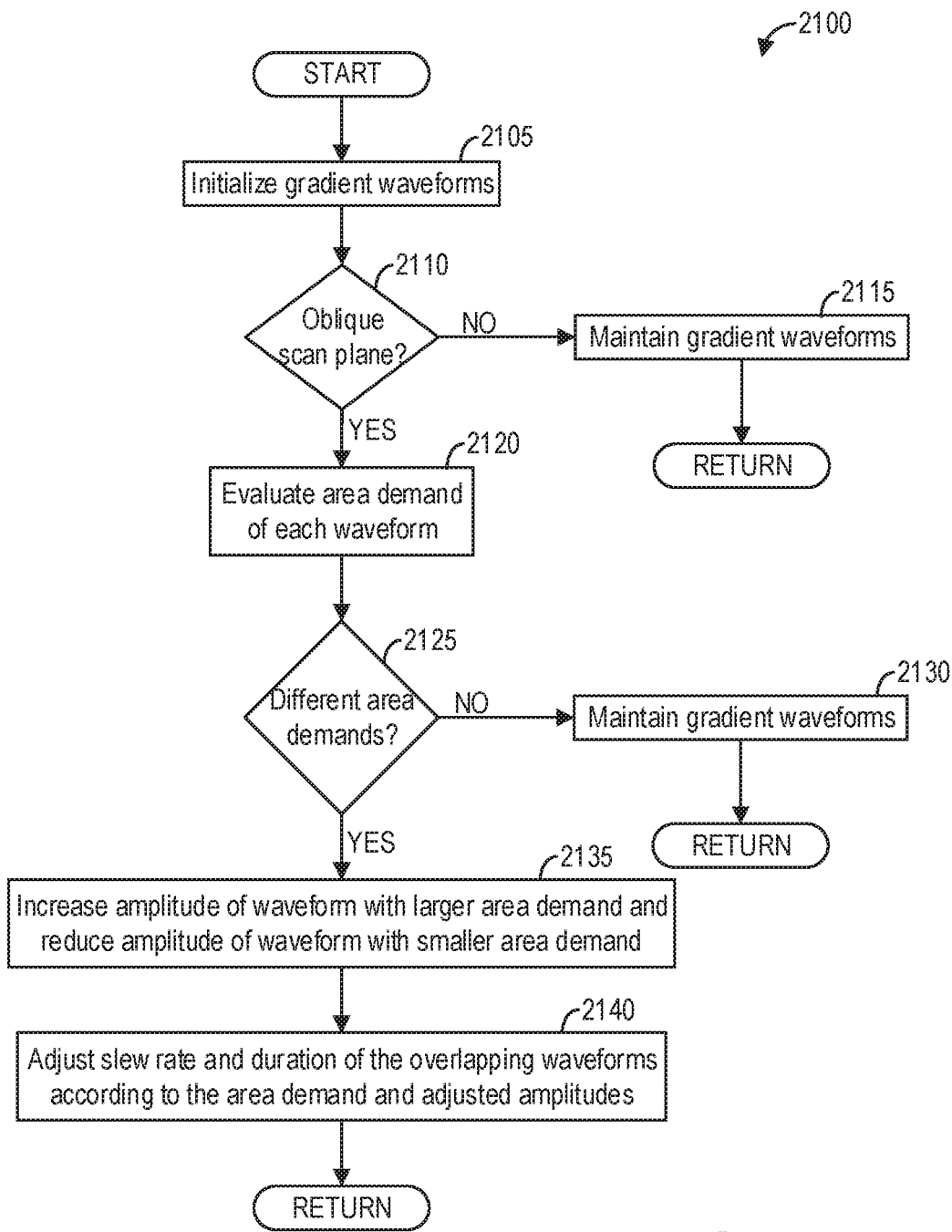
FIG. 21 shows a high-level flow chart illustrating an example method for optimizing waveforms according to an embodiment.
Figure 22:
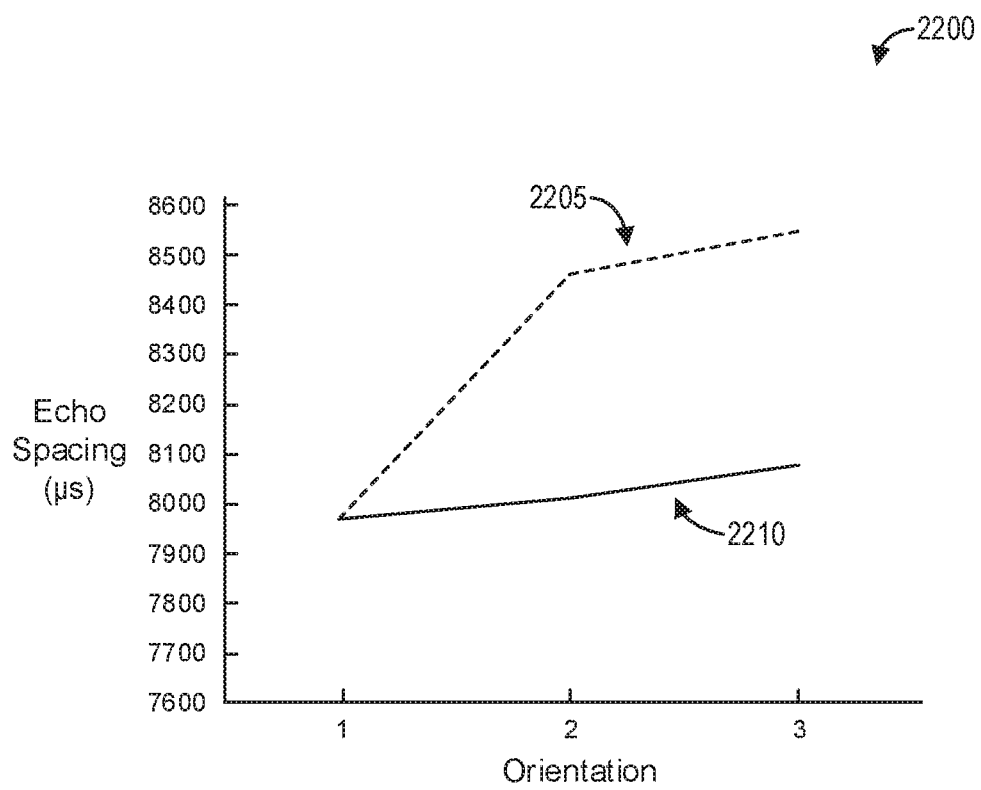
FIG. 22 shows a graph illustrating echo spacing variation for optimized waveforms according to an exemplary embodiment.

FIG. 21 shows a high-level flow chart illustrating an example method 2100 for optimizing waveforms according to an embodiment. Method 2100 is described with regard to the systems and components of FIG. 1, though it should be appreciated that the method 2100 may be implemented with other systems and components without departing from the scope of the present disclosure. Method 2100 may be implemented as executable instructions in non-transitory of the MRI apparatus 10, for example.

Method 2100 begins at 2105. At 2105, gradient waveforms in logical axes are initialized, with one gradient waveform for each logical axis. In some embodiments where the prescribed scan plane is orthogonal, the maximum amplitude in each logical axis may be set the same as the maximum amplitude in the physical axis because the logical axes align with the physical axes. In some embodiments where the prescribed scan plane is oblique, the gradient waves in logical axes may be initialized based on the angle of the oblique plane with respect to orthogonal planes. For example, the gradient waves may be initialized according to diagram 401 of FIG. 4, where the square formed by the maximum values 422 and 442 of waveform amplitudes in logical axes X and Y for the oblique plane is confined within the square formed by the maximum values 412 and 432 of waveform amplitudes in the physical axes. In this way, the maximum amplitudes allocated to the respective waveforms are equal and fully utilize the capacity of the gradient amplifiers (e.g., as illustrated in FIG. 6). If three logical axes are used, the squares shown in diagram 401 can be changed to cubes to initialize the gradient waveforms.

At 2110, it is determined whether the prescribed scan plane is oblique. If it is not oblique scan ("NO"), method 2100 continues to 2115, wherein the initial gradient waveforms obtained at 2105 (i.e., with maximum amplitudes the same as the maximum amplitudes in physical axes) are maintained. Method 2100 then returns.

However, if the prescribed scan plane is oblique ("YES"), method 2100 continues to 2120. At 2120, the area demand of each waveform is evaluated. The area demand may be evaluated based on the pulse sequence, resolution, etc.

At 2125, it is determined whether the area demands of the waveforms in different logical axes are different. As discussed above, pulses in different logical axes start at the same time and have the same area demand for some applications. For other applications, the area demand of overlapping pulses and/or the starting time of overlapping pulses may be different for different logical axes. The waveform optimization discussed herein can be applied to the latter scenario. If the area demands are not different ("NO"), method 2100 continues to 2130, wherein the initial waveforms obtained at 2105 (i.e., equal maximum amplitudes in logical axes) are maintained. Method 2100 then returns.

However, if the area demands are different ("YES"), method 2100 continues to 2135. At 2135, the maximum amplitude of the waveform with the larger area demand is increased and the maximum amplitude of the waveform with the smaller area demand is reduced. Furthermore, continuing at 2140, the slew rate, duration, and timing of the waveforms are adjusted according to the area demand and the adjusted maximum amplitudes. The slew rate, duration, and timing are adjusted such that the maximum slew rates possible by the gradient amplifier are not exceeded. Method 2100 then returns.

FIG. 22 shows a graph 2200 illustrating echo spacing variation for optimized waveforms according to an embodiment. In particular, graph 2200 includes a plot 2205 illustrating the echo spacing for imaging in various orientations with an MRI apparatus that does not include optimized waveforms, as well as a plot 2210 illustrating the echo spacing for imaging in the various orientations with an MRI apparatus that utilizes waveforms optimized according to the methods described herein.

The first orientation (Orientation 1) comprises an axial orientation, the second orientation (Orientation 2) includes a single-angle oblique orientation, and the third orientation (Orientation 3) includes a double-angle oblique orientation. As depicted by plot 2205, the echo spacing substantially increases for the second orientation relative to the first orientation (i.e., when a single-angle oblique orientation is prescribed), and further increases for the third orientation (i.e., when a double-angle oblique orientation is prescribed). In particular, a 6.7% increase in echo spacing is observed between the first orientation and the third orientation.

The echo spacing similarly increases even when the waveforms are optimized, as depicted by plot 2210, but the relative increase is less substantial between orientations. In particular, only a 1.2% variation is observed between the first orientation and the third orientation for MRI apparatuses utilizing optimized waveforms. Thus, oblique scans may be performed without a substantial increase in scan parameters such as echo time, repetition time, and echo spacing, by optimizing the waveforms according to area demand.

A technical effect of the disclosure includes adjusting amplitudes and pulse widths of gradient waveforms according to an angle between logical axes and physical axes. Another technical effect of the disclosure includes the acquisition of MR data in oblique imaging planes with improved timing.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for performing an oblique scan of magnetic resonance (MR), comprising:
    generating initial gradient waveforms in logical axes including a frequency encoding axis, a phase encoding axis, and a slice selection axis;
    evaluating area demand in each of the logical axes;
    increasing a maximum amplitude of the initial gradient waveform in a first logical axis;
    reducing a maximum amplitude of the initial gradient waveform in a second logical axis, wherein the area demand in the first logical axis is greater than the area demand in the second logical axis;
    converting the changed gradient waveforms to physical gradient waveforms, wherein at least one of the physical gradient waveforms includes components of two of the changed gradient waveforms; and
    driving physical amplifiers of an imaging system with the physical gradient waveforms during the oblique scan of MR.

2. The method of claim 1, wherein the maximum amplitudes of the initial gradient waveforms in the logical axes are equal, and wherein the components of the two changed gradient waveforms are restrained by physical constraints of the physical amplifiers when increasing the maximum amplitude of the initial gradient waveform in the first logical axis and reducing the maximum amplitude of the initial gradient waveform in the second logical axis.

3. The method of claim 1, further comprising increasing a slew rate of the initial gradient waveform in the first logical axis.

4. The method of claim 1, further comprising reducing a pulse width of the initial gradient waveform in the first logical axis.

5. The method of claim 1, further comprising reducing a slew rate of the initial gradient waveform in the second logical axis.

6. The method of claim 1, further comprising increasing a pulse width of the initial gradient waveform in the second logical axis.

7. The method of claim 1, further comprising reducing a maximum amplitude of the initial gradient waveform in a third logical axis, wherein the area demand in the first logical axis is greater than the area demand in the third logical axis.

8. A magnetic resonance imaging system, comprising:
    a gradient coil unit including a first gradient coil, a second gradient coil, and a third gradient coil, each gradient coil defining a physical axis;
    a gradient coil driver unit including a first amplifier, a second amplifier, and a third amplifier electrically coupled respectively to the first gradient coil, the second gradient coil, and the third gradient coil; and
    a processor communicatively coupled to the gradient coil driver unit and configured to:
        generate initial gradient waveforms in logical axes including a frequency encoding axis, a phase encoding axis, and a slice selection axis;
        evaluate area demand in each of the logical axes;
        increase a maximum amplitude of the initial gradient waveform in a first logical axis;
        reduce a maximum amplitude of the initial gradient waveform in a second logical axis, wherein the area demand in the first logical axis is greater than the area demand in the second logical axis;
        convert the changed gradient waveforms to physical gradient waveforms, wherein at least one of the physical gradient waveforms includes components of two changed gradient waveforms of the changed gradient waveforms; and
        drive the gradient coil driver unit with the physical gradient waveforms during an oblique scan.

9. The system of claim 8, wherein the maximum amplitudes of the initial gradient waveforms in the logical axes are equal.

10. The system of claim 8, wherein the processor is further configured to increase a slew rate of the initial gradient waveform in the first logical axis.

11. The system of claim 8, wherein the processor is further configured to reduce a pulse width of the initial gradient waveform in the first logical axis.

12. The system of claim 8, wherein the processor is further configured to reduce a slew rate of the initial gradient waveform in the second logical axis.

13. The system of claim 8, wherein the processor is further configured to increase a pulse width of the initial gradient waveform in the second logical axis.

14. A non-transitory computer-readable medium comprising instructions that, when executed, cause a processor to:
    generate initial gradient waveforms in logical axes including a frequency encoding axis, a phase encoding axis, and a slice selection axis;
    evaluate area demand in each of the logical axes;
    increase a maximum amplitude of the initial gradient waveform in a first logical axis;
    reduce a maximum amplitude of the initial gradient waveform in a second logical axis, wherein the area demand in the first logical axis is greater than the area demand in the second logical axis;
    convert the changed gradient waveforms to physical gradient waveforms, wherein at least one of the physical gradient waveforms includes components of two of the changed gradient waveforms; and
    drive physical amplifiers of a magnetic resonance imaging system with the physical gradient waveforms during an oblique scan.

15. The computer-readable medium of claim 14, wherein the maximum amplitudes of the initial gradient waveforms in the logical axes are equal.

16. The computer-readable medium of claim 14, further comprising instructions that, when executed, cause the processor to increase a slew rate of the initial gradient waveform in the first logical axis.

17. The computer-readable medium of claim 14, further comprising instructions that, when executed, cause the processor to decrease a pulse width of the initial gradient waveform in the first logical axis.

18. The computer-readable medium of claim 14, further comprising instructions that, when executed, cause the processor to reduce a slew rate of the initial gradient waveform in the second logical axis.

19. The computer-readable medium of claim 14, further comprising instruction that, when executed, cause the processor to increase a pulse width of the initial gradient waveform in the second logical axis.

20. The computer-readable medium of claim 14, further comprising instructions that, when executed, cause the processor to reduce a maximum amplitude of the initial gradient waveform in a third logical axis, wherein the area demand in the first logical axis is greater than the area demand in the third logical axis.

* * * * *